United States Patent
Watanuki

(10) Patent No.: US 10,358,036 B2
(45) Date of Patent: Jul. 23, 2019

(54) VEHICLE GROUND FAULT DETECTION APPARATUS

(71) Applicant: CALSONIC KANSEI CORPORATION, Saitama-shi, Saitama (JP)

(72) Inventor: Fumihito Watanuki, Saitama (JP)

(73) Assignee: CALSONIC KANSEI CORPORATION, Saitama-shi, Saitama (JP)

( * ) Notice: Subject to any disclaimer, the term of this patent is extended or adjusted under 35 U.S.C. 154(b) by 195 days.

(21) Appl. No.: 15/535,843

(22) PCT Filed: Nov. 10, 2015

(86) PCT No.: PCT/JP2015/005606
§ 371 (c)(1),
(2) Date: Jun. 14, 2017

(87) PCT Pub. No.: WO2016/098277
PCT Pub. Date: Jun. 23, 2016

(65) Prior Publication Data
US 2018/0022218 A1 Jan. 25, 2018

(30) Foreign Application Priority Data
Dec. 18, 2014 (JP) ................. 2014-256277

(51) Int. Cl.
*B60L 3/00* (2019.01)
*G01R 31/00* (2006.01)
(Continued)

(52) U.S. Cl.
CPC .............. *B60L 3/0069* (2013.01); *B60L 1/00* (2013.01); *B60L 53/14* (2019.02); *G01R 31/006* (2013.01);
(Continued)

(58) Field of Classification Search
CPC .......... B60L 3/0069; B60L 3/04; B60L 53/14; B60L 1/00; G01R 31/005; G01R 31/006;
(Continued)

(56) References Cited

U.S. PATENT DOCUMENTS 4,140,964 A * 2/1979 Eubank ................. G01R 31/12
324/551
9,239,350 B2 * 1/2016 Julson .................. G01R 31/007
(Continued)

FOREIGN PATENT DOCUMENTS

JP          S5467657 A    5/1979
JP          H0870503 A    3/1996
(Continued)

OTHER PUBLICATIONS

J-PlatPat JP54-067657 Machine Translation (Year: 1979).*
(Continued)

*Primary Examiner* — Jeff W Natalini
*Assistant Examiner* — Steven L Yeninas
(74) *Attorney, Agent, or Firm* — Kenja IP Law PC

(57) ABSTRACT

A vehicle ground fault detection apparatus (1) detects a ground fault of a high-voltage system electrically insulated from a vehicle body connected to a low-voltage system and includes a transformer (2) blocking a DC component between the low- and high-voltage systems, an oscillation circuit (3), in the low-voltage system, connected to a primary coil (21) of the transformer (2), and a voltage dividing resistor (4), in the high-voltage system, connected to a secondary coil (22) of the transformer (2). The vehicle ground fault detection apparatus (1) measures a positive peak of voltage generated in the voltage dividing resistor (4) by voltage induced in the secondary coil (22) through AC voltage generated by the oscillation circuit (3) and detects the ground fault using the peak voltage. The insulation of the
(Continued)

coupling portion between the ground fault detection circuit and the high-voltage system circuit does not suffer breakdown during temporary AC noise.

10 Claims, 8 Drawing Sheets

(51) Int. Cl.
    *G01R 31/02*     (2006.01)
    *B60L 1/00*     (2006.01)
    *B60L 53/14*     (2019.01)

(52) U.S. Cl.
    CPC ......... *G01R 31/025* (2013.01); *Y02T 10/7005* (2013.01); *Y02T 10/7072* (2013.01); *Y02T 90/14* (2013.01)

(58) Field of Classification Search
    CPC .. G01R 31/007; G01R 31/024; G01R 31/025; G01R 31/3835; H02H 3/16
    USPC .......... 324/503, 509; 361/42, 45, 49
    See application file for complete search history.

(56) References Cited

U.S. PATENT DOCUMENTS

| | | | |
|---|---|---|---|
| 9,748,832 B2* | 8/2017 | Nishikawa | H02H 3/33 |
| 2006/0114001 A1* | 6/2006 | Wang | G01R 31/025 |
| | | | 324/523 |
| 2007/0147097 A1* | 6/2007 | Huang | H02H 7/1222 |
| | | | 363/55 |
| 2013/0308230 A1* | 11/2013 | Ando | H02J 7/0031 |
| | | | 361/42 |
| 2014/0347769 A1* | 11/2014 | Kanda | H01M 10/44 |
| | | | 361/42 |
| 2015/0127201 A1* | 5/2015 | Nishio | B60L 3/04 |
| | | | 701/22 |
| 2015/0291088 A1* | 10/2015 | Ueno | H02M 7/48 |
| | | | 315/77 |

FOREIGN PATENT DOCUMENTS

| | | |
|---|---|---|
| JP | 2001330643 A | 11/2001 |
| JP | 2005233822 A | 9/2005 |
| JP | 2011176662 A | 9/2011 |
| JP | 2012037278 A | 2/2012 |
| JP | 2013255297 A | 12/2013 |

OTHER PUBLICATIONS

Feb. 2, 2016, International Search Report issued in the International Patent Application No. PCT/JP2015/005606.

Jun. 22, 2017, International Preliminary Report on Patentability issued in the International Patent Application No. PCT/JP2015/005606.

Jan. 28, 2019, Office Action issued by the State Intellectual Property Office in the corresponding Chinese Patent Application No. 201580069236.3 with English language Concise Explanation Document.

* cited by examiner

VEHICLE GROUND FAULT DETECTION APPARATUS

CROSS-REFERENCE TO RELATED APPLICATION

This application claims priority to and the benefit of Japanese Patent Application No. 2014-256277 filed Dec. 18, 2014, the entire contents of which are incorporated herein by reference.

TECHNICAL FIELD

This disclosure relates to a vehicle ground fault detection apparatus for detecting a ground fault of a high-voltage system that is electrically insulated from a vehicle body.

BACKGROUND

A ground fault detection circuit has been used to detect a ground fault between the body of a vehicle, such as an electric car, and a high-voltage power source disposed in the vehicle. In general, a ground fault detection circuit is included in the control circuit of a low-voltage system and needs to be protected by being insulated from a high-voltage circuit. Upon being separated and completely insulated, however, the circuit cannot fulfill its function of detecting a ground fault. Therefore, the high-voltage system circuit and the ground fault detection circuit are coupled with a coupling capacitor to block only the DC component of voltage, while allowing the AC component of voltage to propagate. JP 2005-233822 A (PTL 1) discloses a configuration for detecting a ground fault using such a coupling capacitor. FIG. 8 is a circuit diagram illustrating a simplification of this configuration. For example, when a ground fault has occurred on the negative electrode side of a high-voltage battery 91, the output voltage of the high-voltage battery 91 is divided between a ground fault resistor 92 and a common voltage control resistor 93. In this case, by comparing the voltage at the edges of the coupling capacitor 94 with a predetermined reference value, the occurrence of a ground fault can be detected.

In a configuration using a coupling capacitor as above, a ground fault is detected by utilizing the property that propagation is good with respect to an AC signal. At the same time, however, this means that a coupling capacitor has low resistance with respect to the AC signal, leading to the risk of breakdown from temporary AC noise.

Temporary AC noise is often due to a commercial power source and may occur in conventional commercial power sources. Conventionally, vehicles using a ground fault detection circuit have been employed in limited areas, and sufficient withstand voltage even for coupling with a coupling capacitor has been provided under the assumption of such temporary noise.

CITATION LIST

Patent Literature

PTL 1: JP 2005-233822 A

SUMMARY

Technical Problem

It is expected, however, that the areas in which vehicles using a ground fault detection circuit are employed will expand, making it difficult to predict the type of noise sources that may be connected. This makes it necessary to prepare by increasing the withstand voltage of the ground fault detection circuit, i.e. the coupling portion between the low-voltage system circuit and the high-voltage system circuit. In this case, the AC withstand voltage may become insufficient with the coupling capacitor.

Therefore, it would be helpful to provide a vehicle ground fault detection apparatus in which the insulation of the coupling portion between the low-voltage system circuit and the high-voltage system circuit has a low chance of breakdown even when temporary AC noise occurs.

Solution to Problem

To this end, a vehicle ground fault detection apparatus according to a first aspect of this disclosure is for detecting a ground fault of a high-voltage system that is electrically insulated from a vehicle body and has a battery connected thereto, a low-voltage system being connected to the vehicle body, the vehicle ground fault detection apparatus comprising:
a transformer configured to block a DC component between the low-voltage system and the high-voltage system;
an oscillation circuit provided in the low-voltage system and connected to a primary coil of the transformer; and
a voltage dividing resistor provided in the high-voltage system and connected to a secondary coil of the transformer; wherein
the vehicle ground fault detection apparatus measures a peak voltage of the voltage dividing resistor, the peak voltage being a positive peak value of voltage generated in the voltage dividing resistor by voltage induced in the secondary coil of the transformer in accordance with AC voltage generated by the oscillation circuit; and
the vehicle ground fault detection apparatus detects the ground fault of the high-voltage system using the peak voltage of the voltage dividing resistor.

A vehicle ground fault detection apparatus according to a second aspect compares the peak voltage of the voltage dividing resistor with a first predetermined value and detects the ground fault of the high-voltage system when the peak voltage is lower.

A vehicle ground fault detection apparatus according to a third aspect compares the peak voltage of the voltage dividing resistor with a second predetermined value and determines that wiring between the secondary coil of the transformer and the voltage dividing resistor is disconnected when the peak voltage is lower; and
the second predetermined value is lower than the first predetermined value.

A vehicle ground fault detection apparatus according to a fourth aspect causes a cell monitoring IC included in the high-voltage system to
measure the peak voltage of the voltage dividing resistor; and
transmit the result of measuring the peak voltage to a low-voltage system control circuit included in the low-voltage system over wiring provided between the low-voltage system control circuit and the cell monitoring IC.

A vehicle ground fault detection apparatus according to a fifth aspect further causes the cell monitoring IC to
detect the ground fault of the high-voltage system using the peak voltage of the voltage dividing resistor; and transmit a result of detecting the ground fault to the low-voltage system control circuit included in the low-voltage system over wiring provided between the low-voltage system control circuit and the cell monitoring IC.

A vehicle ground fault detection apparatus according to a sixth aspect transmits a result of measuring the peak voltage of the voltage dividing resistor through the transformer to a low-voltage system control circuit included in the low-voltage system.

A vehicle ground fault detection apparatus according to a seventh aspect causes the low-voltage system control circuit to detect the ground fault of the high-voltage system using the peak voltage of the voltage dividing resistor.

In a vehicle ground fault detection apparatus according to an eighth aspect, the oscillation circuit is configured as a differential circuit that combines circuits respectively outputting positive and negative voltages.

In a vehicle ground fault detection apparatus according to an ninth aspect, a number of turns of the secondary coil of the transformer is greater than a number of turns of the primary coil of the transformer.

Advantageous Effect

In the vehicle ground fault detection apparatus according to the first aspect, the insulation of the coupling portion between the low-voltage system circuit and the high-voltage system circuit has a low chance of breakdown even when temporary AC noise occurs.

The vehicle ground fault detection apparatus according to the second aspect can easily detect lowering of the insulation resistance and can detect a high-voltage system ground fault.

The vehicle ground fault detection apparatus according to the third aspect can detect disconnection of the wiring for ground fault detection without requiring a separate configuration.

The vehicle ground fault detection apparatus according to the fourth aspect can detect a ground fault without increasing the number of components by using an existing cell monitoring IC.

The vehicle ground fault detection apparatus according to the fifth aspect can detect a ground fault without increasing the number of components by using an existing cell monitoring IC.

The vehicle ground fault detection apparatus according to the sixth aspect can transmit the peak voltage of the voltage dividing resistor used in determination of a ground fault to the low-voltage system control circuit without requiring a separate configuration.

The vehicle ground fault detection apparatus according to the seventh aspect can detect a ground fault without increasing the number of components by using an existing control circuit.

The vehicle ground fault detection apparatus according to the eighth aspect can increase the resistance to common mode noise.

The vehicle ground fault detection apparatus according to the ninth aspect simplifies measurement of the AC voltage generated in the voltage dividing resistor.

BRIEF DESCRIPTION OF THE DRAWINGS

In the accompanying drawings.

DETAILED DESCRIPTION

The following describes embodiments of this disclosure in detail with reference to the drawings.

Figure 1:
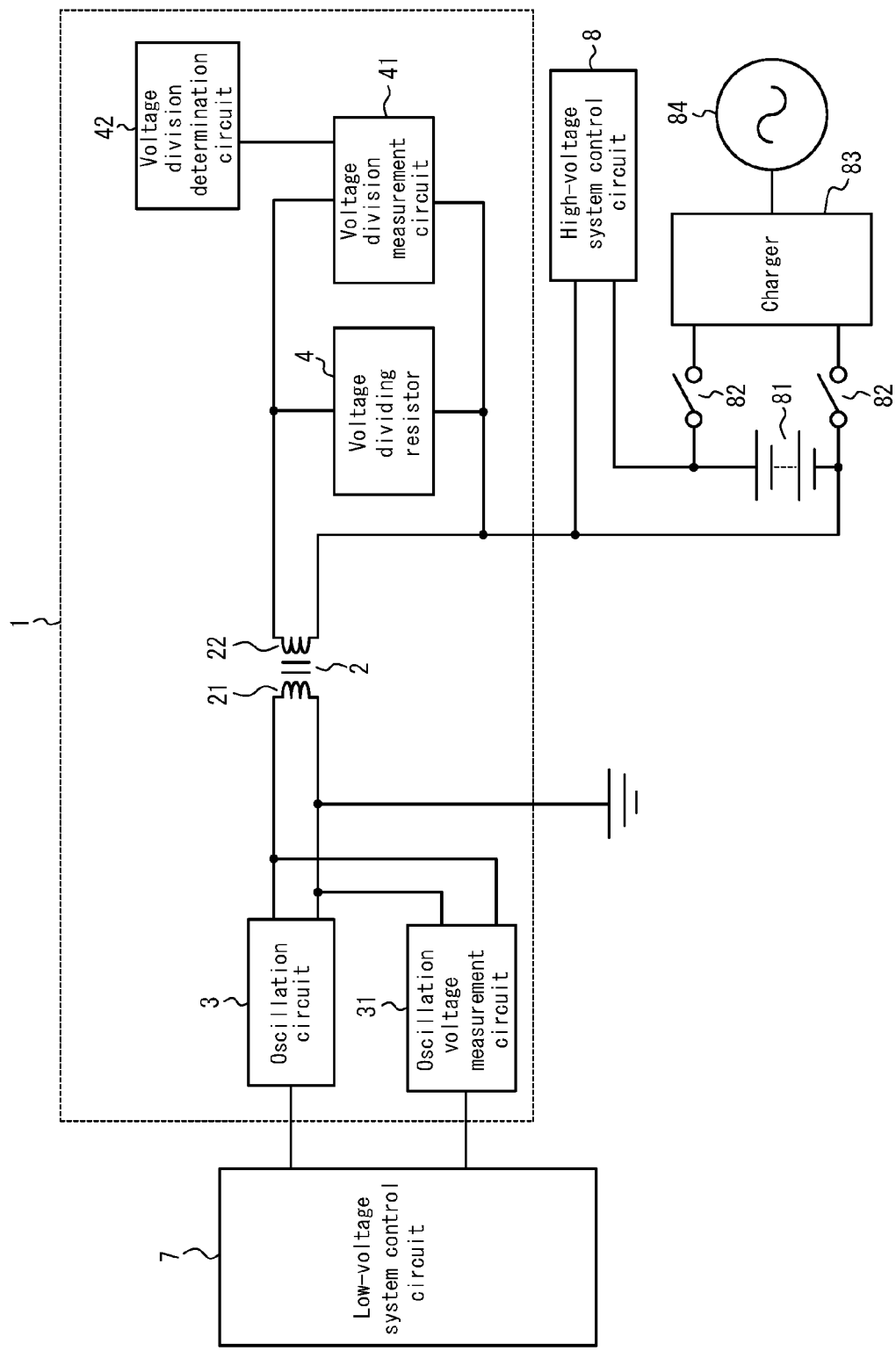
FIG. 1 is a block diagram of a vehicle ground fault detection apparatus according to one embodiment.

FIG. 1 is a block diagram of the control system in a vehicle that includes a vehicle ground fault detection apparatus 1 according to this embodiment. The control system of the vehicle includes a low-voltage system, which includes a low-voltage system control circuit 7, and a high-voltage system, which includes a high-voltage system control circuit 8. The low-voltage system control circuit 7 is grounded to the vehicle body. A battery 81 is connected to the high-voltage system control circuit 8. The output voltage of the battery 81 is several hundred volts in this embodiment but is not limited to this example. The battery 81 is connected to a charger 83 via a switch 82. The charger 83 is further connected to a commercial power supply 84. Since the components included in the low-voltage system are likely to be damaged by the application of a high voltage, the low-voltage system and the high-voltage system are electrically insulated in the control system of the vehicle. If a ground fault does occur between the high-voltage system and the vehicle body (high-voltage system ground fault), a high voltage might be applied to the components included in the low-voltage system. Hence, measures for resolving a ground fault in the high-voltage system are necessary.

The vehicle ground fault detection apparatus 1 according to this embodiment is arranged across a low-voltage system and a high-voltage system, monitors for a high-voltage system ground fault, and issues a warning encouraging resolution of the ground fault when a high-voltage system ground fault occurs. The vehicle ground fault detection apparatus 1 according to this embodiment includes a transformer 2, an oscillation circuit 3, and a voltage dividing resistor 4. The transformer 2 is arranged between the low-voltage system and the high-voltage system so as to connect a circuit in the low-voltage system with a circuit in the high-voltage system. One end of a primary coil 21 of the transformer 2 is preferably grounded to the vehicle body. The transformer 2 functions to block a DC component while propagating a signal between the low-voltage system and the high-voltage system. The oscillation circuit 3 is arranged on the low-voltage system side. The oscillation circuit 3 is connected to the primary coil 21 of the transformer 2. The voltage dividing resistor 4 is arranged on the high-voltage system side. The voltage dividing resistor 4 is connected to a secondary coil 22 of the transformer 2. A voltage division measurement circuit 41 for measuring the voltage at both ends of the voltage dividing resistor 4 is arranged on the high-voltage system side. The voltage division measurement circuit 41 is connected to both ends of the voltage dividing resistor 4. A voltage division determination circuit 42 that determines whether a high-voltage system ground fault has occurred by referring to the voltage of the voltage dividing resistor 4 is preferably disposed on the high-voltage system side and connected to the voltage division measurement circuit 41.

The transformer 2 is preferably a typical transformer for communication. The transformer 2 is also preferably molded as a measure against magnetic leakage. With such molding, the effect of leakage flux from the transformer 2 on other components can be suppressed. The transformer 2 preferably has a turn ratio of one between the primary coil 21 and the secondary coil 22, but the turn ratio is not limited to one. The number of turns of the secondary coil 22 is preferably greater than the number of turns of the primary coil 21. In this case, the voltage induced in the secondary coil 22 increases.

The oscillation circuit 3 outputs a square wave with a frequency of 2 Hz as the AC voltage, and the peak value of this voltage is from −5 V to +5 V, but these values are not limiting. A triangular wave or a sinusoidal wave is preferably output as the AC voltage. In general terms, any voltage waveform whose magnitude and polarity change periodically may be output. Various circuit configurations are possible for the oscillation circuit 3. The oscillation circuit 3 is preferably a differential circuit that combines circuits respectively outputting positive and negative voltages. An oscillation voltage measurement circuit 31 for measuring the output voltage of the oscillation circuit 3 is preferably provided. The oscillation voltage measurement circuit 31 is connected to both ends of the oscillation circuit 3.

The voltage dividing resistor 4 preferably has a resistance of several kΩ to hundreds of kΩ. Also, the voltage dividing resistor 4 is preferably configured with one or a plurality of resistors. Current flows into the voltage dividing resistor 4 because of voltage induced in the secondary coil 22 of the transformer 2. Voltage is generated in the voltage dividing resistor 4 because of this current. The voltage division measurement circuit 41 measures this voltage. When the number of turns of the secondary coil 22 of the transformer 2 is greater than the number of turns of the primary coil 21, the voltage induced in the secondary coil 22 increases, and the voltage generated in the voltage dividing resistor 4 also increases. In this case, the voltage generated in the voltage dividing resistor 4 is more easily measured by the voltage division measurement circuit 41.

The voltage division determination circuit 42 detects a high-voltage system ground fault by determining whether a high-voltage system ground fault has occurred with reference to the measured value of the voltage generated in the voltage dividing resistor 4. The voltage division determination circuit 42 of the vehicle ground fault detection apparatus 1 according to this embodiment is disposed in the high-voltage system and connected to the voltage division measurement circuit 41, but this configuration is not limiting. The voltage division determination circuit 42 is preferably included in the low-voltage system control circuit 7, receives the measured value of the voltage generated in the voltage dividing resistor 4 from the voltage division measurement circuit 41, and determines whether a high-voltage system ground fault has occurred by referring to the received measured value. The vehicle ground fault detection apparatus 1 preferably includes wiring for transmitting the measured value from the voltage division measurement circuit 41 to the low-voltage system control circuit 7.

The vehicle ground fault detection apparatus 1 according to this embodiment is configured to detect a high-voltage system ground fault by transmitting the AC voltage output by the oscillation circuit 3 provided in the low-voltage system to the high-voltage system using the transformer 2. Another possibility is to provide an oscillation circuit on the high-voltage system side (Comparative Example). In this Comparative Example, the oscillation circuit consumes each cell of the battery 81 directly, which may cause variation in the voltage of each cell. By contrast, in the vehicle ground fault detection apparatus 1 according to this embodiment, the oscillation circuit 3 is disposed on the low-voltage system side. Therefore, the battery 81 of the high-voltage system is not consumed directly, which prevents variation in the voltage of each cell of the battery 81.

Ground Fault Detection Method of the Vehicle Ground Fault Detection Apparatus

Figure 2:
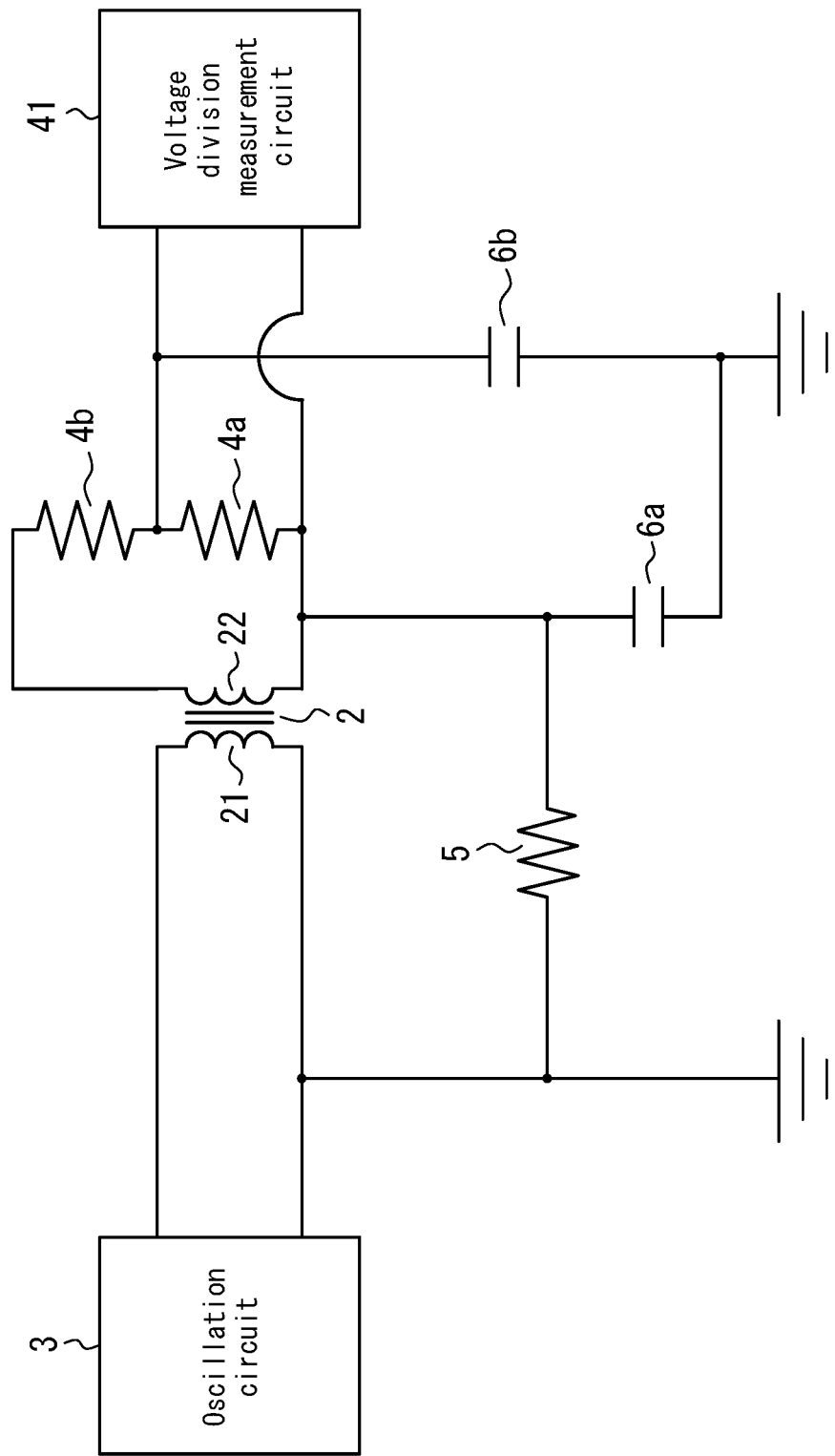
FIG. 2 is an equivalent circuit illustrating a method for detecting a high-voltage system ground fault.

The method by which the vehicle ground fault detection apparatus 1 detects a high-voltage system ground fault is described. FIG. 2 is an equivalent circuit illustrating the portion of the vehicle ground fault detection apparatus 1 necessary to explain the method for detecting a high-voltage system ground fault. Unlike the block diagram in FIG. 1, FIG. 2 includes an insulation resistor 5 and floating capacitors 6a, 6b that are an equivalent circuit representation of the parasitic resistance and parasitic capacitance existing virtually between the high-voltage system and the vehicle body. Two resistors are provided as the voltage dividing resistor 4, i.e. voltage dividing resistor 4a and voltage dividing resistor 4b. The resistance of the voltage dividing resistor 4a and the resistance of the voltage dividing resistor 4b are preferably equal. The voltage division measurement circuit 41 is connected to both ends of the voltage dividing resistor 4a. One end of the insulation resistor 5 is grounded, and the other end of the insulation resistor 5 is connected to one end of the secondary coil 22 of the transformer 2. One end of the floating capacitor 6a is grounded, and the other end of the floating capacitor 6a is connected to one end of the secondary coil 22 of the transformer 2 along with the insulation resistor 5. One end of the floating capacitor 6b is grounded, and the other end of the floating capacitor 6b is connected to the connection point between the voltage dividing resistor 4a and the voltage dividing resistor 4b. On the basis of this equivalent circuit, the waveform of voltage generated in the voltage dividing resistor 4a and measured by the voltage division measurement circuit 41 in accordance with the AC voltage output by the oscillation circuit 3 is simulated below with a circuit simulator.

Figure 3:
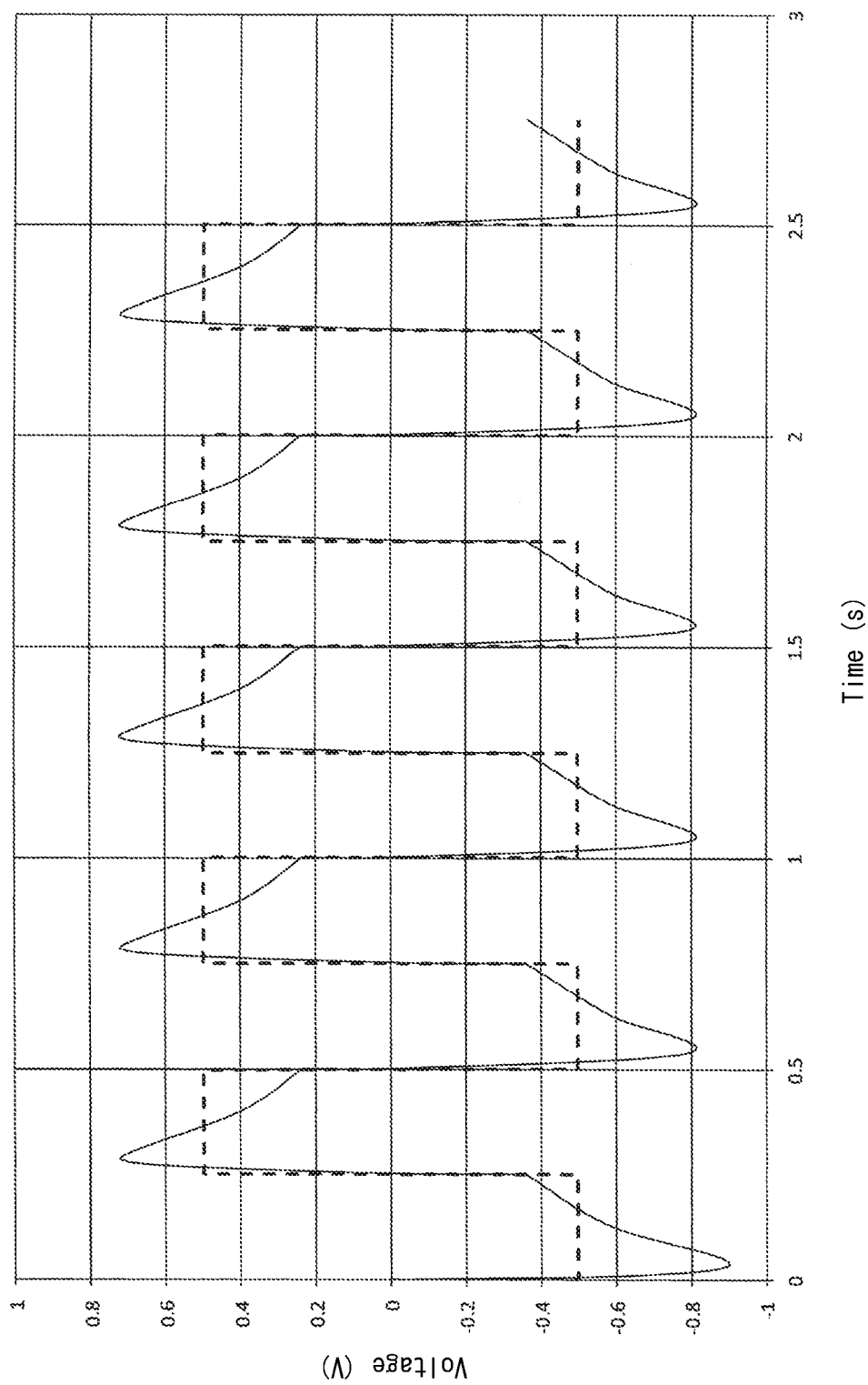
FIG. 3 illustrates the waveform of AC voltage input into the primary coil of a transformer and the waveform of AC voltage measured at both ends of a voltage dividing resistor when a ground fault has not occurred in the high-voltage system.

The waveform of voltage generated in the voltage dividing resistor 4a when a ground fault has not occurred in the high-voltage system, i.e. when an insulated state is maintained between the high-voltage system and the vehicle body, is described. The resistance of the insulation resistor 5 in the equivalent circuit in FIG. 2 in order to maintain the insulated state between the high-voltage system and the vehicle body is an extremely high value (for example, 100 MΩ). The resistance of the voltage dividing resistors 4a and 4b is several kΩ to hundreds of kΩ, and the resistances of the voltage dividing resistors 4a and 4b are equal. First, the oscillation circuit 3 outputs AC voltage. The AC voltage output by the oscillation circuit 3 is a square wave with a frequency of 2 Hz. The peak value of the voltage is from −5 V to +5 V. The AC voltage output by the oscillation circuit 3 is not limited to this example and may have a different frequency and peak value or may be another form, such as a triangular wave or a sinusoidal wave. Next, the AC voltage output by the oscillation circuit 3 is input into the primary coil 21 of the transformer 2. Upon AC voltage being input into the primary coil 21, voltage is induced in the secondary coil 22, and current flows in the secondary coil 22. The current is divided between the voltage dividing resistors 4a, 4b and the insulation resistor 5. In this case, however, since the resistance of the insulation resistor 5 is 100 MΩ, almost all of the current flows into the voltage dividing resistors 4a, 4b. By current flowing in the voltage dividing resistors 4a, 4b, voltage is generated in the voltage dividing resistors 4a, 4b. The voltage generated in the voltage dividing resistor 4a is simulated by a circuit simulator. FIG. 3 illustrates the waveform of AC voltage input into the primary coil 21 of the transformer 2 and the waveform of voltage generated in the voltage dividing resistor 4a when a ground fault has not occurred in the high-voltage system. The waveform of the input AC voltage is indicated with a dashed line, and the waveform of voltage generated in the voltage dividing resistor 4a is indicated with a solid line. While the input AC voltage is a negative voltage, the voltage generated in the voltage dividing resistor 4a first reaches the negative peak value and subsequently rises. Next, the input AC voltage switches to being a positive voltage, and the voltage generated in the voltage dividing resistor 4a reaches the positive peak value and subsequently falls. This cycle then repeats. In this embodiment, the peak value of the voltage generated in the voltage dividing resistor 4a when a ground fault has not occurred in the high-voltage system is approximately −0.75 V to +0.75 V.

Figure 4:
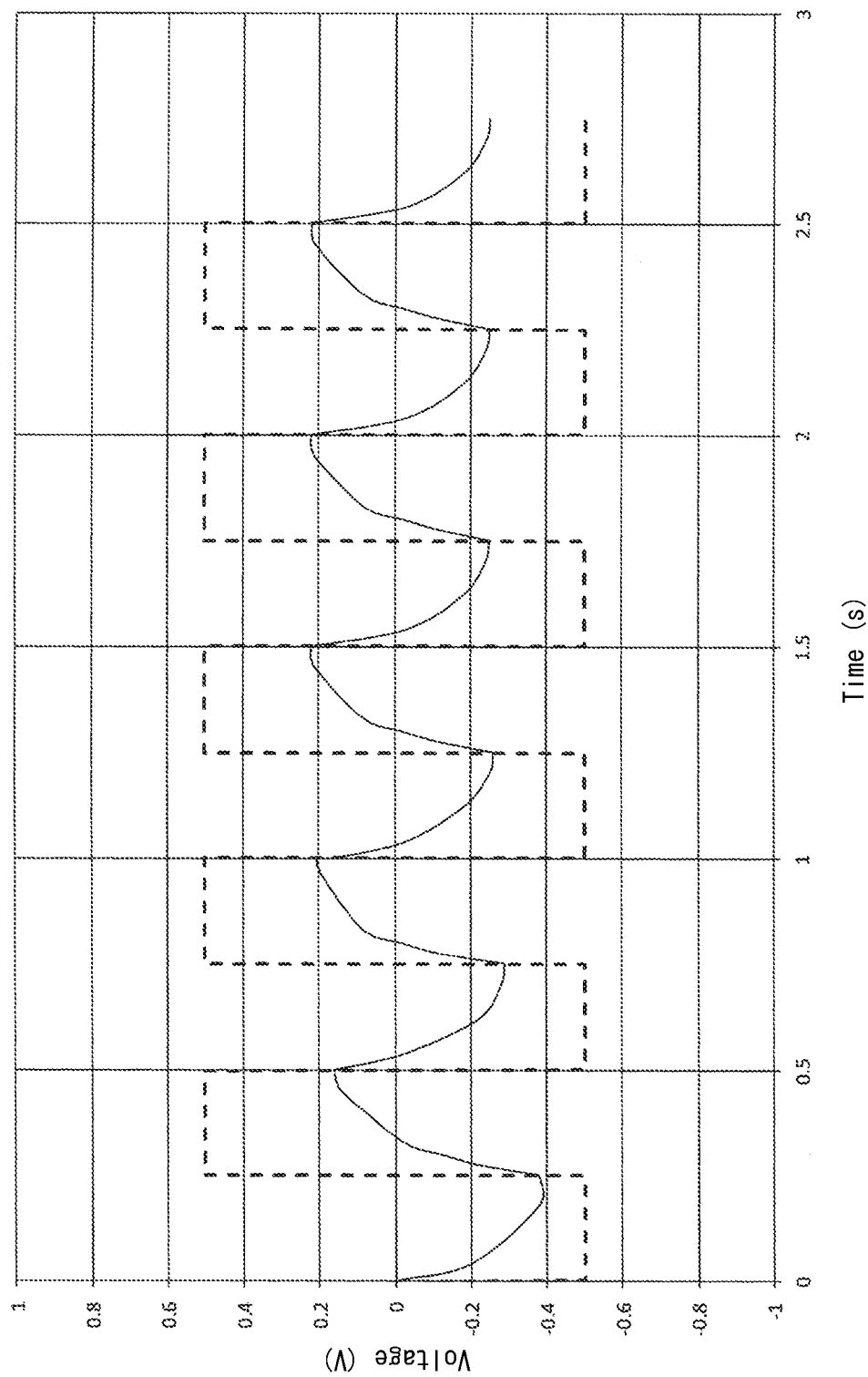
FIG. 4 illustrates the waveform of AC voltage input into the primary coil of a transformer and the waveform of AC voltage measured at both ends of a voltage dividing resistor when a ground fault has occurred in the high-voltage system.

Next, the waveform of voltage generated in the voltage dividing resistor 4a when a ground fault has occurred in the high-voltage system is described. In this case, the resistance of the insulation resistor 5 lowers, and the resistance of the insulation resistor 5 in the equivalent circuit in FIG. 2 becomes a small value (for example, 1 kΩ). The other circuit parameters are the same as when a ground fault has not occurred in the high-voltage system. Also in the same way, the oscillation circuit 3 outputs voltage, the voltage output by the oscillation circuit 3 is input into the primary coil 21 of the transformer 2, voltage is induced in the secondary coil 22, and current flows in the secondary coil 22. The current that flows by being divided between the voltage dividing resistors 4a, 4b and the insulation resistor 5 differs between when a ground fault has and has not occurred in the high-voltage system. Since the resistance of the insulation resistor 5 is lower than the resistance of several kΩ to hundreds of kΩ of the voltage dividing resistors 4a and 4b, more current is diverted to the insulation resistor 5. Accordingly, the current flowing in the voltage dividing resistors 4a, 4b reduces, lowering the voltage generated in the voltage dividing resistor 4a. FIG. 4 illustrates the waveform of AC voltage input into the primary coil 21 of the transformer 2 and the waveform of voltage generated in the voltage dividing resistor 4a when a ground fault has occurred in the high-voltage system. The waveform of the input AC voltage is indicated with a dashed line, and the waveform of voltage generated in the voltage dividing resistor 4a is indicated with a solid line. Since the voltage flowing into the voltage dividing resistors 4a, 4b is reduced, the peak value of the voltage generated in the voltage dividing resistor 4a is lower than when no ground fault has occurred in the high-voltage system. In this embodiment, the peak value of the voltage generated in the voltage dividing resistor 4a when a ground fault has occurred in the high-voltage system is approximately −0.25 V to +0.25 V.

The vehicle ground fault detection apparatus 1 can determine whether a ground fault has occurred in the high-voltage system by referring to the peak value of the voltage generated in the voltage dividing resistor 4a. The voltage generated in the voltage dividing resistor 4a has positive and negative peak values. The absolute values of the positive and negative peak values are almost the same. Therefore, in this embodiment, the positive peak value of the voltage generated in the voltage dividing resistor 4a is considered to be the peak voltage of the voltage dividing resistor 4a. The voltage division determination circuit 42 of the vehicle ground fault detection apparatus 1 preferably detects a high-voltage system ground fault by determining whether a ground fault has occurred in the high-voltage system with reference to the peak voltage of the voltage dividing resistor 4a.

The voltage division determination circuit 42 of the vehicle ground fault detection apparatus 1 can determine whether a ground fault has occurred in the high-voltage system by referring to the peak voltage of the voltage dividing resistor 4a. First, the voltage division determination circuit 42 compares the peak voltage of the voltage dividing resistor 4a with a first predetermined value. When the peak voltage of the voltage dividing resistor 4a is higher, the voltage division determination circuit 42 determines that a ground fault has not occurred in the high-voltage system. When the peak voltage of the voltage dividing resistor 4a is lower, the voltage division determination circuit 42 preferably determines that a ground fault has occurred in the high-voltage system. The first predetermined value is set in accordance with the resistance of the voltage dividing resistor. In this embodiment, the peak value of the voltage generated in the voltage dividing resistor 4a when a ground fault has not occurred in the high-voltage system is approximately −0.75 V to +0.75 V. In other words, since the positive peak value is approximately 0.75 V, i.e. the peak voltage of the voltage dividing resistor 4a is approximately 0.75 V, the first predetermined value is preferably less than 0.75 V. With this approach, the voltage division determination circuit 42 can detect a high-voltage system ground fault by comparing the peak voltage of the voltage dividing resistor with the first predetermined value for easy detection of a decrease in the insulation resistance.

Next, the voltage division determination circuit 42 preferably makes a further determination when the peak voltage of the voltage dividing resistor 4a is less than the first predetermined value. The peak voltage of the voltage dividing resistor 4a is less than the first predetermined value not only when a ground fault has occurred in the high-voltage system, but also when the secondary coil 22 of the transformer 2 is disconnected from the voltage dividing resistors 4a, 4b. In other words, when the secondary coil 22 of the transformer 2 is disconnected from the voltage dividing resistors 4a, 4b, current from the secondary coil 22 does not flow into the voltage dividing resistors 4a, 4b. The peak voltage of the voltage dividing resistor 4a thus becomes zero. Therefore, the voltage division determination circuit 42 preferably further compares the peak voltage of the voltage dividing resistor 4a with a second predetermined value. When the peak voltage of the voltage dividing resistor 4a is lower, the voltage division determination circuit 42 determines that the secondary coil 22 of the transformer 2 is disconnected from the voltage dividing resistors 4a, 4b. The second predetermined value is determined in accordance with the first predetermined value and the configuration of the voltage division measurement circuit and is lower than the first predetermined value. In this embodiment, the peak value of the voltage generated in the voltage dividing resistor 4a when a ground fault has occurred in the high-voltage system is approximately −0.25 V to +0.25 V. In other words, since the positive peak value is approximately 0.25 V, i.e. the peak voltage of the voltage dividing resistor 4a is approximately 0.25 V, the second predetermined value is preferably less than 0.25 V. With this approach, the voltage division determination circuit 42 can determine whether the secondary coil 22 and the voltage dividing resistor 4 are disconnected by comparing the peak voltage of the voltage dividing resistor with the second predetermined value.

Accordingly, when the peak voltage of the voltage dividing resistor 4a is lower than the first predetermined value and higher than the second predetermined value, the voltage division determination circuit 42 preferably determines that the resistance of the insulation resistor 5 has lowered and that a ground fault has occurred in the high-voltage system. The voltage division determination circuit 42 also preferably counts the number of times the resistance of the insulation resistor 5 decreases and determines that a ground fault has occurred in the high-voltage system upon reaching a predetermined number.

The voltage division determination circuit 42 of the vehicle ground fault detection apparatus 1 according to this embodiment transmits the determination result to the low-voltage system control circuit 7. While many transmission methods are possible, a dedicated wire connecting the vehicle ground fault detection apparatus 1 and the low-voltage system control circuit 7 is preferably provided and used for transmission. Also, a voltage signal is preferably input into the secondary coil 22 of the transformer 2 and then transmitted to the low-voltage system control circuit 7 by the oscillation voltage measurement circuit 31 detecting a voltage signal induced in the primary coil 21 of the transformer 1. Transmitting voltage signals between the primary and secondary sides of the transformer 2 in this way allows voltage signals to be transmitted without increasing the number of components. The low-voltage system control circuit 7 that receives the determination result preferably controls the vehicle in accordance with the determination result. When it is determined that a ground fault has occurred in the high-voltage system, or that the wiring connecting the voltage dividing resistor 4 has been disconnected, the low-voltage system control circuit 7 preferably blocks the connection between the battery 81 and the charger 83 by turning the switch 82 off to prevent charging, stops the vehicle, or takes other such measures.

The above-described method for transmitting the determination result to the low-voltage system control circuit 7 may also be used when transmitting the peak voltage of the voltage dividing resistor, as measured by the voltage division measurement circuit 41, to the low-voltage system control circuit 7. The low-voltage system control circuit 7 preferably receives the peak voltage of the voltage dividing resistor with the above-described method and determines, with reference to the peak voltage, whether a ground fault has occurred in the high-voltage system or whether the wiring connecting the voltage dividing resistor 4 is disconnected. On the basis of the determination result, the low-voltage system control circuit 7 preferably blocks the connection between the battery 81 and the charger 83 by turning the switch 82 off, stops the vehicle, or takes other such measures. With this approach, a ground fault can be detected using an existing control circuit, without increasing the number of components.

Figure 5:
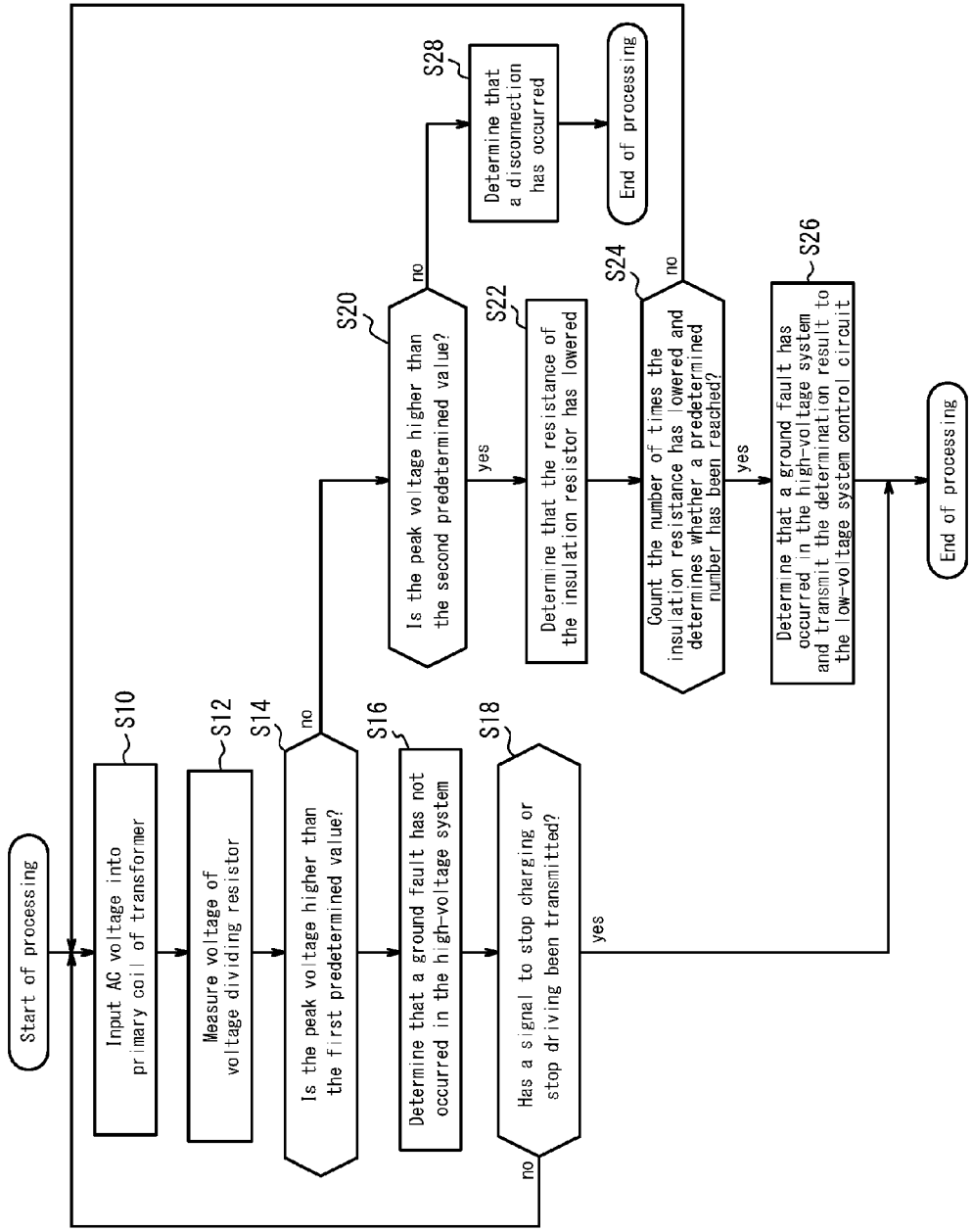
FIG. 5 is a flowchart illustrating operations of the vehicle ground fault detection apparatus according to one embodiment.

FIG. 5 is a flowchart illustrating operations of the vehicle ground fault detection apparatus 1 according to this embodiment. First, the vehicle ground fault detection apparatus 1 generates AC voltage using the oscillation circuit 3 and inputs this AC voltage into the primary coil 21 of the transformer 2 (step S10). Next, as a result of voltage induced in the secondary coil 22 of the transformer 2, voltage is generated in the voltage dividing resistor 4a, and the vehicle ground fault detection apparatus 1 uses the voltage division measurement circuit 41 to measure the peak voltage of the voltage dividing resistor 4a (step S12). The vehicle ground fault detection apparatus 1 then uses the voltage division determination circuit 42 to compare the peak voltage of the voltage dividing resistor 4a with the first predetermined value and to determine whether the peak voltage of the voltage dividing resistor 4a is higher (step S14).

When the peak voltage of the voltage dividing resistor 4a is higher than the first predetermined value (step S14: yes), the voltage division determination circuit 42 determines that a ground fault has not occurred in the high-voltage system (step S16). The vehicle ground fault detection apparatus 1 then determines whether a signal to stop charging or stop driving has been transmitted from the low-voltage system control circuit 7 or the high-voltage system control circuit 8 of the vehicle control system (step S18). When such a signal has been transmitted (step S18: yes), the vehicle ground fault detection apparatus 1 terminates ground fault detection operations. When such a signal has not been transmitted (step S18: no), the vehicle ground fault detection apparatus 1 returns to step S10 and continues operations.

When the peak voltage of the voltage dividing resistor 4a is lower than the first predetermined value (step S14: no), the voltage division determination circuit 42 of the vehicle ground fault detection apparatus 1 then compares the peak voltage of the voltage dividing resistor 4a with the second predetermined value and determines whether the peak voltage of the voltage dividing resistor 4a is higher (step S20).

When the peak voltage of the voltage dividing resistor 4a is higher than the second predetermined value (step S20: yes), the voltage division determination circuit 42 determines that the resistance of the insulation resistor 5 has lowered (step S22). Next, the voltage division determination circuit 42 counts the number of times the resistance of the insulation resistor 5 has lowered and determines whether a predetermined number has been reached (step S24). When lowering of the resistance of the insulation resistor 5 has been detected at least a predetermined number of times (step S24: yes), the voltage division determination circuit 42 determines that a ground fault has occurred in the high-voltage system and transmits the determination result to the low-voltage system control circuit 7 (step S26). The vehicle ground fault detection apparatus 1 then terminates ground fault detection operations. When lowering of the resistance of the insulation resistor 5 has been detected less than a predetermined number of times (step S24: no), the vehicle ground fault detection apparatus 1 returns to step S10 and continues operations.

When the peak voltage of the voltage dividing resistor 4a is less than the second predetermined value (step S20: yes), the voltage division determination circuit 42 of the vehicle ground fault detection apparatus 1 determines that the secondary coil 22 of the transformer 2 and the voltage dividing resistors 4a, 4b have been disconnected, transmits the determination result to the low-voltage system control circuit 7 (step S28), and terminates ground fault detection operations.

In this way, instead of using a coupling capacitor to couple the low-voltage system and the high-voltage system, the vehicle ground fault detection apparatus 1 according to this embodiment uses the transformer 2, which has a higher AC withstand voltage than a coupling capacitor. A vehicle ground fault detection apparatus in which the insulation of the coupling portion between the low-voltage system circuit and the high-voltage system circuit has a low chance of breakdown even when temporary AC noise occurs can thus be provided.

Modification 1

Figure 6:
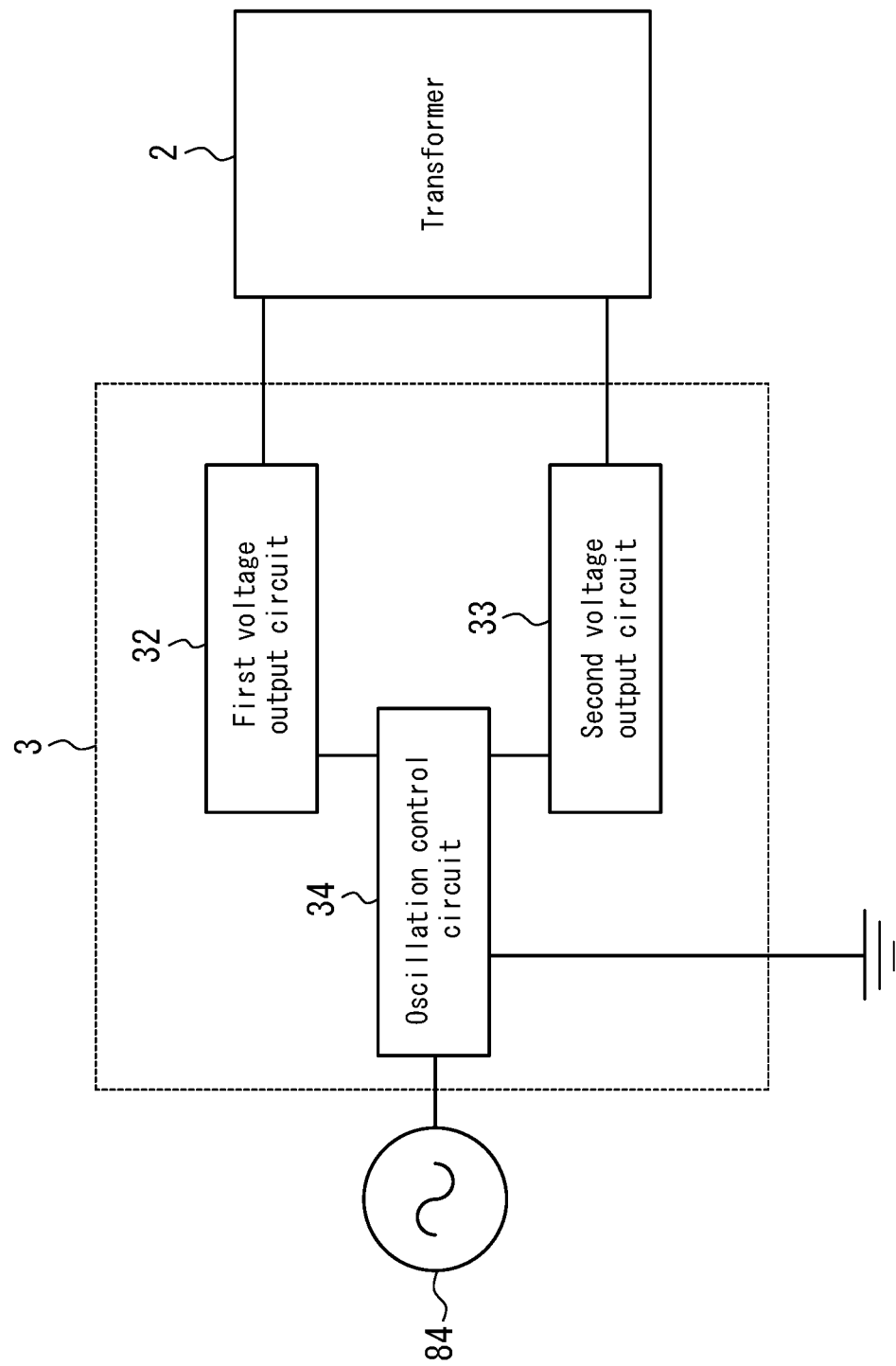
FIG. 6 is a block diagram of an oscillation circuit according to Modification 1.

As Modification 1 to the vehicle ground fault detection apparatus 1 according to this embodiment, the case of configuring the oscillation circuit 3 as a differential circuit is described. FIG. 6 is a block diagram in which the oscillation circuit 3 is configured as a differential circuit. The oscillation circuit 3 includes a first voltage output circuit 32 and a second voltage output circuit 33. An oscillation control circuit 34 is connected to the first voltage output circuit 32 and the second voltage output circuit 33 and controls the timing at which voltage is output to the respective oscillation circuits. The oscillation control circuit 34 is connected to the commercial power supply 84 and is also grounded, preferably to the vehicle body. The output terminal of the first voltage output circuit 32 and the output terminal of the second voltage output circuit 33 are connected to the respective ends of the primary coil 21 of the transformer 2.

The following describes the case of the oscillation circuit 3 outputting AC voltage as a square wave with a frequency of 2 Hz and a peak value from −5 V to +5 V. The sign of the voltage applied to the primary coil 21 of the transformer 2 is positive when the voltage of the terminal connected to the first voltage output circuit 32 is higher than the voltage of the terminal connected to the second voltage output circuit 33. For the first 0.25 seconds, the output terminal of the first voltage output circuit 32 is first grounded, and the second voltage output circuit 33 outputs +5 V of DC voltage. In this case, voltage of −5 V is applied to the primary coil 21 of the transformer 2. For the next 0.25 seconds, the output terminal of the second voltage output circuit 33 is grounded, and the first voltage output circuit 32 outputs +5 V of DC voltage. In this case, voltage of +5 V is applied to the primary coil 21 of the transformer 2. For the next 0.25 seconds, the output terminal of the first voltage output circuit 32 is grounded, and the second voltage output circuit 33 outputs −5 V of DC voltage. Then, for the next 0.25 seconds, the output terminal of the second voltage output circuit 33 is grounded, and the first voltage output circuit 32 outputs +5 V of DC voltage. By repetition of these operations, the AC voltage indicated by the dashed lines in FIG. 2 or 3 is input into the primary coil 21 of the transformer 2, i.e. AC voltage as a square wave with a frequency of 2 Hz and a peak value from −5 V to +5 V.

AC noise is sometimes input from the commercial power supply 84 connected to the oscillation control circuit 34. In this case, the AC noise is input as common mode noise into the first voltage output circuit 32 and second voltage output circuit 33 connected to the oscillation control circuit 34 as a differential circuit, and these noises cancel out at the output destination. Accordingly, by configuring the oscillation circuit 3 as a differential circuit, the resistance to common mode noise can be increased.

Modification 2

As Modification 2 to the vehicle ground fault detection apparatus 1 according to this embodiment, a configuration using a cell monitoring IC 85 to replace the functions of the voltage division measurement circuit 41 and the voltage division determination circuit 42 is described. The cell monitoring IC 85 controls the cell voltage of the battery 81.

Figure 7:
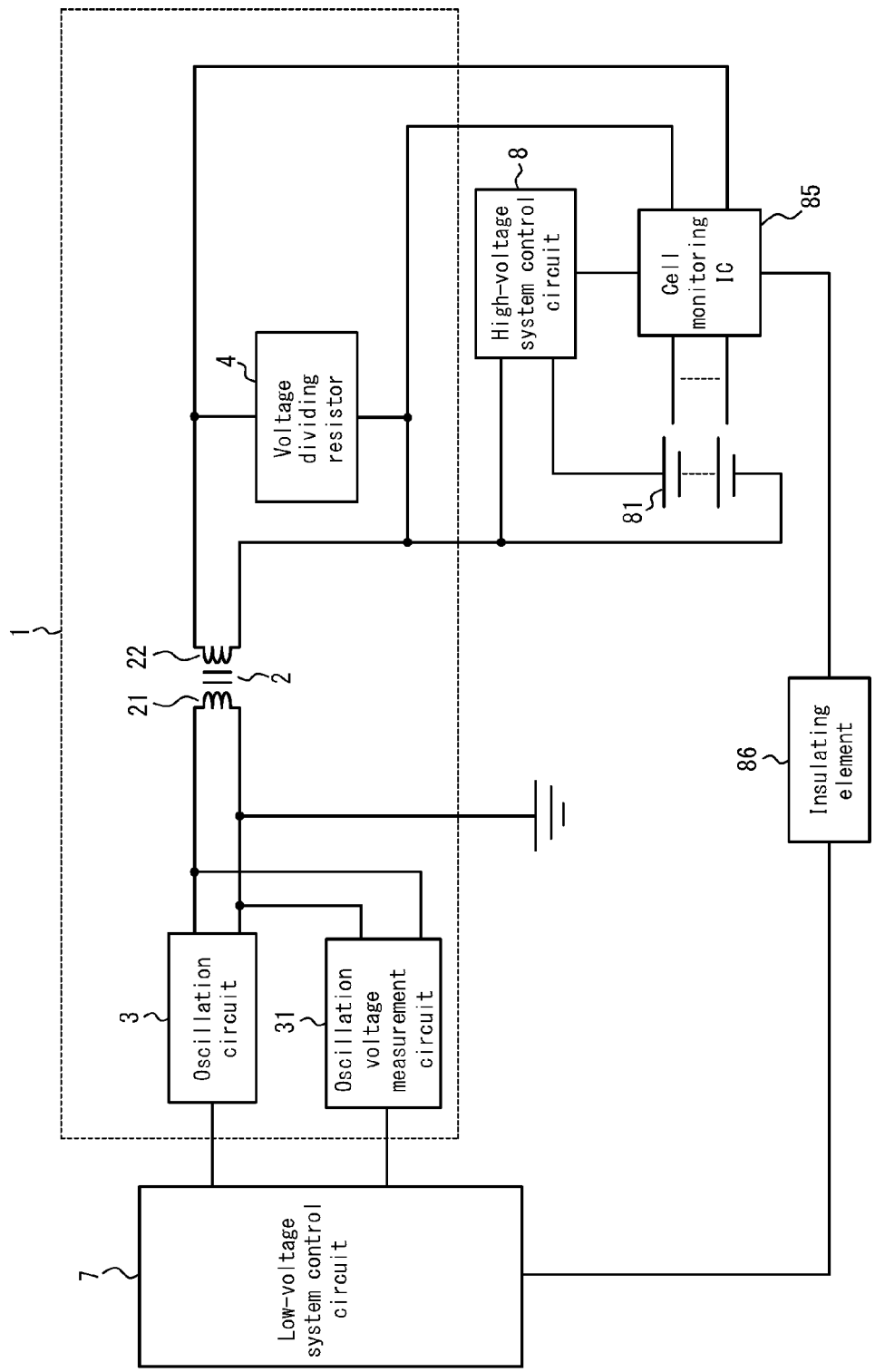
FIG. 7 is a block diagram of a vehicle ground fault detection apparatus according to Modification 2.
Figure 8:
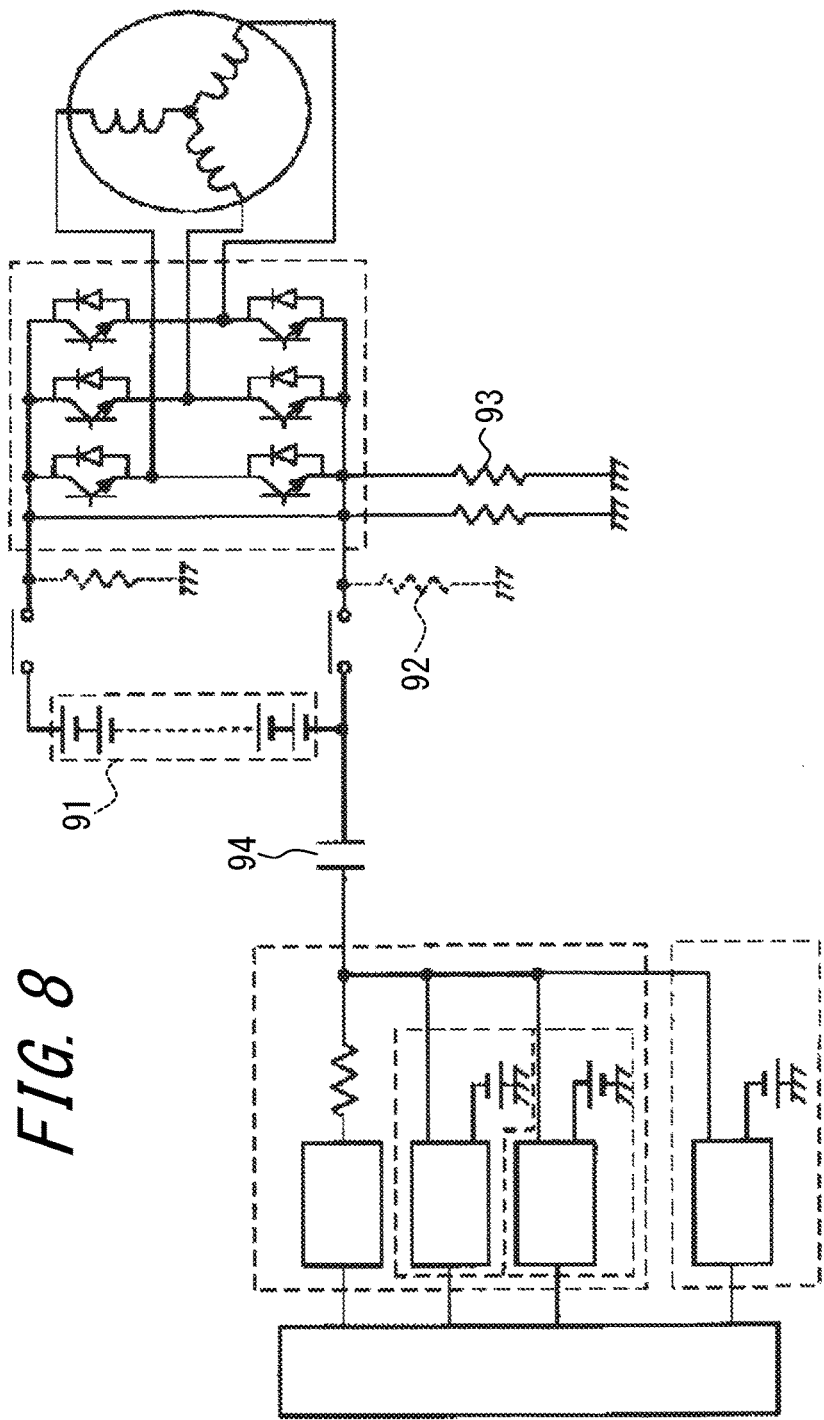
FIG. 8 is a circuit diagram illustrating a configuration for detecting a ground fault using a coupling capacitor.

FIG. 7 is a block diagram of this modification. The differences from FIG. 1 are described. First, the cell monitoring IC 85 is disposed in the high-voltage system. The cell monitoring IC 85 is connected to and controls each of the cells of the battery 81. The cell monitoring IC 85 is also connected to the high-voltage system control circuit 8. Furthermore, the cell monitoring IC 85 is connected to the low-voltage system control circuit 7 via an insulating element 86. With such a connection through the insulating element 86, signals can be transmitted and received while maintaining insulation between the low-voltage system and the high-voltage system. A photocoupler is preferably used as the insulating element 86. The wiring between the cell monitoring IC 85 and the low-voltage system control circuit 7 preferably includes two wires: a wire used for signal transmission from the cell monitoring IC 85, and a wire used for signal reception in the cell monitoring IC 85. The insulating element 86 is preferably provided in each of these wires.

The cell monitoring IC 85 is preferably connected to both ends of the voltage dividing resistor 4 of the vehicle ground fault detection apparatus 1. As a result, the cell monitoring IC 85 can measure voltage generated in the voltage dividing resistor 4 and replace the functions of the voltage division measurement circuit 41. The cell monitoring IC 85 preferably transmits the measured voltage of the voltage dividing resistor 4 to the low-voltage system control circuit 7. The cell monitoring IC 85 preferably replaces the functions of the voltage division determination circuit 42 and determines whether disconnection or a ground fault has occurred. The cell monitoring IC 85 even more preferably transmits the determination result obtained by replacing the functions of the voltage division determination circuit 42 to the low-voltage system control circuit 7 through the insulating element 86. In this way, by causing the cell monitoring IC 85 to replace the functions of the voltage division measurement circuit 41 and the voltage division determination circuit 42, the vehicle ground fault detection apparatus 1 can measure voltage generated in the voltage dividing resistor and transmit signals without increasing the number of components.

Although this disclosure is based on embodiments and drawings, it is to be noted that various changes and modifications will be apparent to those skilled in the art based on this disclosure. Therefore, such changes and modifications are to be understood as included within the scope of this disclosure. For example, the functions and the like included in the various components and steps may be reordered in any logically consistent way. Furthermore, components and steps may be combined into one or divided.

REFERENCE SIGNS LIST

1 Vehicle ground fault detection apparatus
2 Transformer
21 Primary coil 22 Secondary coil
3 Oscillation circuit
31 Oscillation voltage measurement circuit
32 First voltage output circuit
33 Second voltage output circuit
34 Oscillation control circuit
4, 4a, 4b Voltage dividing resistor
41 Voltage division measurement circuit
42 Voltage division determination circuit
5 Insulation resistor
6a, 6b Floating capacitor
7 Low-voltage system control circuit
8 High-voltage system control circuit
81 Battery
82 Switch
83 Charger
84 Commercial power supply
85 Cell monitoring IC
86 Insulating element
91 Battery
92 Ground fault resistor
93 Common voltage control resistor
94 Coupling capacitor

The invention claimed is:

1. A vehicle ground fault detection apparatus for detecting a ground fault of a high-voltage system that is electrically insulated from a vehicle body and has a battery connected thereto, a low-voltage system being connected to the vehicle body, the vehicle ground fault detection apparatus comprising:
a transformer configured to block a DC component between the low-voltage system and the high-voltage system;
an oscillation circuit provided in the low-voltage system and connected to a primary coil of the transformer; and
a voltage dividing resistor provided in the high-voltage system and connected to a secondary coil of the transformer; wherein
the vehicle ground fault detection apparatus measures a peak voltage of the voltage dividing resistor, the peak voltage being a positive peak value of voltage generated in the voltage dividing resistor by voltage induced in the secondary coil of the transformer in accordance with AC voltage generated by the oscillation circuit; and
the vehicle ground fault detection apparatus detects the ground fault of the high-voltage system using the peak voltage of the voltage dividing resistor.

2. The vehicle ground fault detection apparatus of claim 1, wherein the vehicle ground fault detection apparatus compares the peak voltage of the voltage dividing resistor with a first predetermined value and detects the ground fault of the high-voltage system when the peak voltage is lower.

3. The vehicle ground fault detection apparatus of claim 2, wherein
the vehicle ground fault detection apparatus compares the peak voltage of the voltage dividing resistor with a second predetermined value and determines that wiring between the secondary coil of the transformer and the voltage dividing resistor is disconnected when the peak voltage is lower; and
the second predetermined value is lower than the first predetermined value.

4. The vehicle ground fault detection apparatus of claim 1, wherein
the vehicle ground fault detection apparatus causes a cell monitoring IC included in the high-voltage system to measure the peak voltage of the voltage dividing resistor; and
transmit a result of measuring the peak voltage to a low-voltage system control circuit included in the low-voltage system over wiring provided between the low-voltage system control circuit and the cell monitoring IC.

5. The vehicle ground fault detection apparatus of claim 4, wherein
the vehicle ground fault detection apparatus further causes the cell monitoring IC to
detect the ground fault of the high-voltage system using the peak voltage of the voltage dividing resistor; and
transmit a result of detecting the ground fault to the low-voltage system control circuit included in the low-voltage system over wiring provided between the low-voltage system control circuit and the cell monitoring IC.

6. The vehicle ground fault detection apparatus of claim 4, wherein the vehicle ground fault detection apparatus causes the low-voltage system control circuit to detect the ground fault of the high-voltage system using the peak voltage of the voltage dividing resistor.

7. The vehicle ground fault detection apparatus of claim 1, wherein the vehicle ground fault detection apparatus transmits a result of measuring the peak voltage of the voltage dividing resistor through the transformer to a low-voltage system control circuit included in the low-voltage system.

8. The vehicle ground fault detection apparatus of claim 7, wherein the vehicle ground fault detection apparatus causes the low-voltage system control circuit to detect the ground fault of the high-voltage system using the peak voltage of the voltage dividing resistor.

9. The vehicle ground fault detection apparatus of claim 1, wherein the oscillation circuit is configured as a differential circuit that combines circuits respectively outputting positive and negative voltages.

10. The vehicle ground fault detection apparatus of claim 1, wherein a number of turns of the secondary coil of the transformer is greater than a number of turns of the primary coil of the transformer.

* * * * *